United States Patent [19]
Grallert

[11] Patent Number: 4,658,239
[45] Date of Patent: Apr. 14, 1987

[54] DIFFERENTIAL PULSE CODE MODULATION CODER

[75] Inventor: Hans-Joachim Grallert, Groebenzell, Fed. Rep. of Germany

[73] Assignee: Siemens Aktiengesellschaft, Berlin and Munich, Fed. Rep. of Germany

[21] Appl. No.: 766,503

[22] Filed: Aug. 19, 1985

[30] Foreign Application Priority Data

Sep. 14, 1984 [DE] Fed. Rep. of Germany ....... 3433840

[51] Int. Cl.$^4$ ............................................. H03M 3/04
[52] U.S. Cl. .......................... 340/347 AD; 332/11 D; 375/27
[58] Field of Search ................... 340/347 AD, 347 M; 332/11 D; 375/27–33; 358/13, 135

[56] References Cited

U.S. PATENT DOCUMENTS 4,470,146  9/1984  Yatsuzuka et al. ................. 375/30
4,541,102  9/1985  Grallert ............................ 375/30

OTHER PUBLICATIONS

Globecom '82–Conference Record (1982), pp. 246–248.
P. Maruta, "Per–Channel ADPCM Codec for Multi––Purpose Applications", pp. 244–245.

Primary Examiner—Thomas J. Sloyan
Attorney, Agent, or Firm—Hill, Van Santen, Steadman & Simpson

[57] ABSTRACT

A differential pulse code modulation coder has a pair of series connected arithmetic units connected to the input of a quantizer, with the output of the quantizer connected through a first multiplier to an input of the second arithmetic unit, and the output of the quantizer connected through an adder and further multiplier to the second input of the first arithmetic unit, the second input of said adder being derived from the the output of said second multiplier, whereby greater internal calculation speed is realized.

11 Claims, 4 Drawing Figures

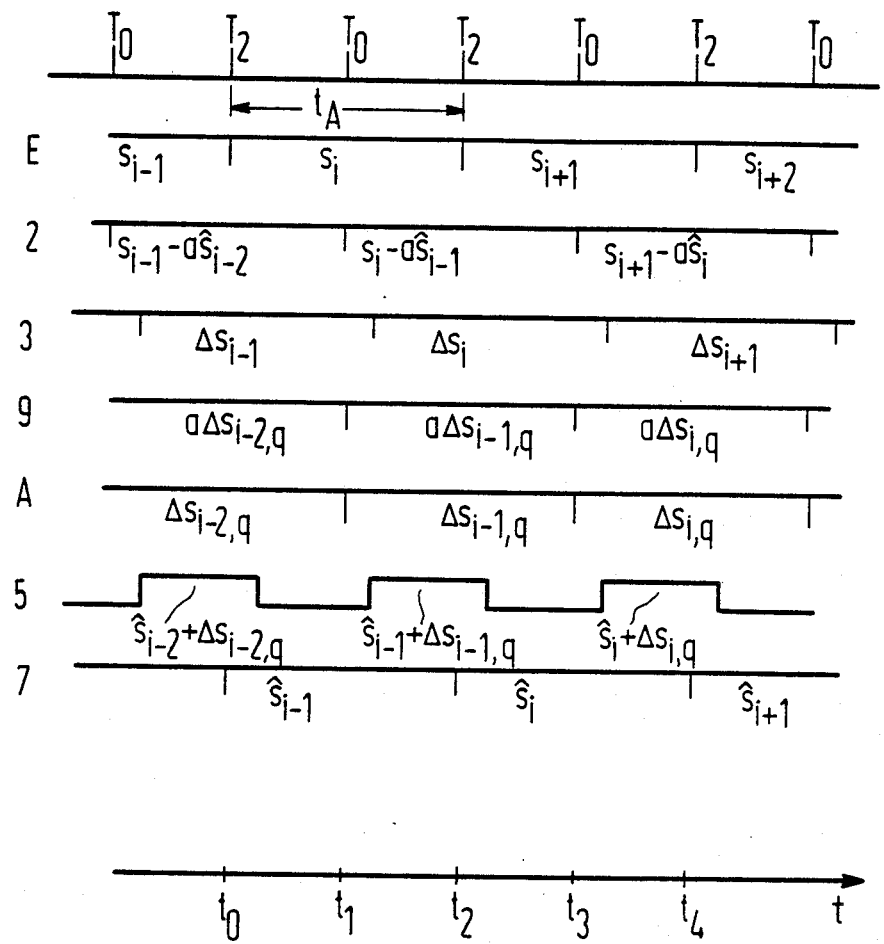

DIFFERENTIAL PULSE CODE MODULATION CODER

BACKGROUND OF THE INVENTION

1. Field of the Invention

The present invention relates to a differential pulse code modulation coder and more particularly to such a coder with a greater speed of internal calculation.

2. The Prior Art

The differential pulse code modulation method (DPCM) is often used in connection with the digital transmission and storage of signals. For every current sample $s_i$, an estimated value is calculated from preceding samples. The difference between the current sample $s_i$ and the estimated value is quantized and subsequently transmitted. This method achieves the advantage of allowing a shorter word length than is required for the representation of the samples $s_i$. Accordingly, the transmission rate is increased, and the memory capacity requirement is significantly reduced. Given a standard DPCM coder such as described, for example, in FIG. 1 of the German patent OS No. 32 32 516, four arithmetic operations are required within a sampling interval $t_A$ for processing the samples $s_i$. These arithmetic operations are composed of a subtraction, a quantization, an addition and a multiplication. In the German patent referred to, the internal calculating speed is reduced by the use of the quantizer used, and by a plurality of arithmetic loops.

BRIEF DESCRIPTION OF THE INVENTION

It is a principal object of the present invention to provide a DPCM coder with greater internal calculating speed and an economical construction.

This object is achieved in the present invention by providing a DPCM coder incorporating a first and a second subtractor preceeding the quantizing unit, with a connection between the output of the quantizing unit and the second subtrator. The first subtractor is also connected to the output of the quantizing unit, through an adder, and a multiplier.

A prerequisite of the DPCM coder of the present invention is the provision of a prediction factor a, where $a = 2^n$, where $n = 1, 2, 3 \ldots$. In this case, the calculation time required for the multiplier is eliminated, since the multiplication is accomplished simply by wiring.

As a result, the present invention exhibits increased speed, without requiring expensive and complicated construction. These and other objects of the present invention will become manifest by an inspection of the following description and the accompanying drawings

BRIEF DESCRIPTION OF THE DRAWINGS

Reference will now be made to the accompanying drawings in which:

FIG. 4 is a timing diagram illustrating operation of the apparatus of FIG. 1.

DESCRIPTION OF THE PREFERRED EMBODIMENT

Figure 1:
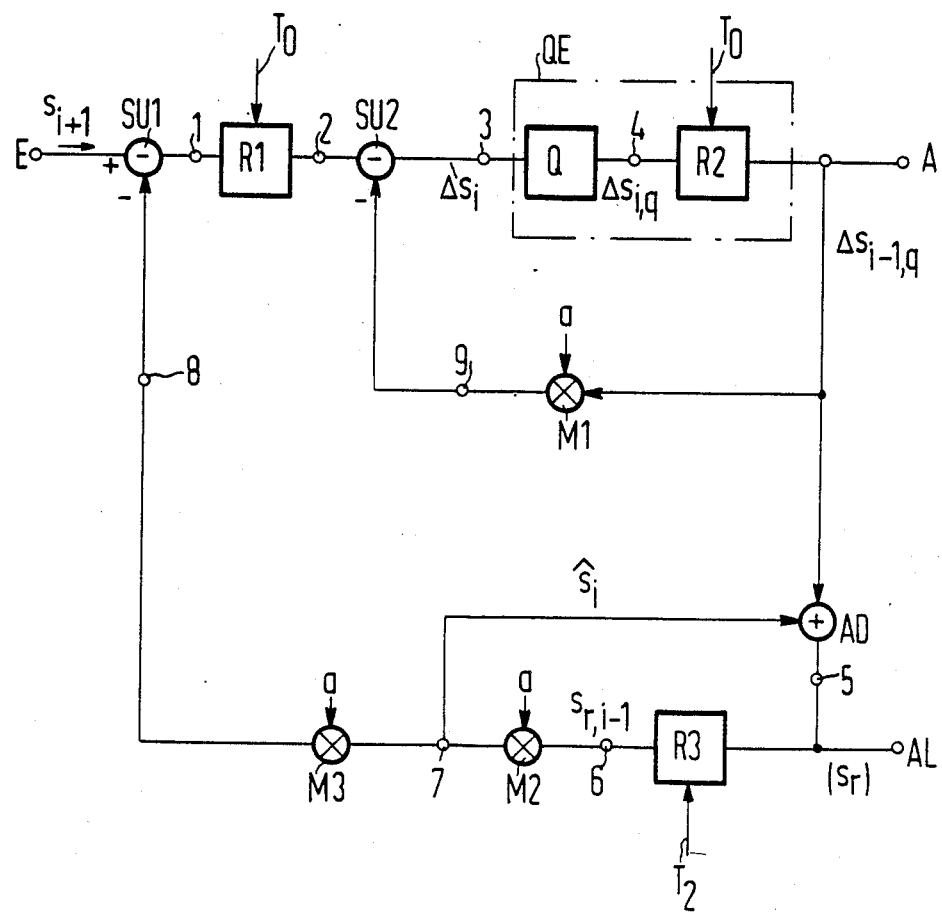
FIG. 1 is a circuit diagram of a DPCM coder incorporating an illustrative embodiment of the present invention.

The digitized samples $s_i$ are supplied to the input of the DPCM coder shown in FIG. 1 at the input terminal E. The terminal E is connected to a first subtractor SU1, the output of which is connected through a first register R1 to an input of a second subtractor SU2. The output of the latter is connected to the input of a quantizing unit QE the output of which simultaneously forms the signal output A of the DPCM coder, exhibiting the DPCM values $\Delta s_i$. The quantizer unit QE contains a quantizer Q with a register R2 connected to its output. A gate-array or a read-only memory is preferably employed as a quantizer Q.

The signal output A is fed back through a first multiplier M1 to the subtraction input of the second subtractor SU2. The multiplier M1 multiplies its input value by a constant prediction factor a.

The signal output A is also fed back through an adder AD, a third register R3, a second multiplier unit M2 and a third multiplier unit M3 to the subtraction input of the first subtractor SU1. The multiplier units M2 and M3 both multiply the input by the multiplier a. The output of the second multiplier unit M2 is also connected to the second input of the adder AD. The output of the adder AD simultaneously forms the so-called local output AL, representing the reconstruction values $s_r$, which are required for the control of the quantizer in a multidimensional DPCM loop. The output of the third register R3 can, if desired, also be employed as the local output.

The function of the DPCM coder will now be described from a theoretical standpoint. The DPCM coder is designed to supply DPCM values $\Delta s_{i,q}$ at its output, and these values are acquired by quantizing the calculated DPCM signals $\Delta s_i$. The equation for calculation of the DPCM signal $\Delta s_i$ is:

$$\Delta s_i = s_i - \hat{s}_i \tag{F1}$$

The equation for calculation of the estimated value $\hat{s}_i$ is:

$$\hat{s}_i = a(s_{i-1} + \Delta s_{i-1,q}) \tag{F2}$$

$$s_{i-1} = a(s_{i-2} + \Delta s_{i-2,q}) \tag{F3}$$

With equation (F3) inserted into equation (F2):

$$\hat{s}_i = a[a(s_{i-2} + \Delta s_{i-2,q}) + \Delta s_{i-1,q}] \tag{F4}$$

$$\hat{s}_i = a^2(s_{i-2} + \Delta s_{i-2,q}) + a\Delta s_{i-1,q} \tag{F5}$$

$$\hat{s}_i = a \, s_{i-1} + a\Delta s_{i-1,q} \tag{F6}$$

The reconstruction value output $s_{r,i}$ is defined by:

$$s_{r,i} = \hat{s}_i + \Delta s_{i,q} = a(s_{i-1} + \Delta s_{i-1,q}) + \Delta s_{i,q} \tag{F7}$$

The estimated value $\hat{s}_i$ is calculated in the DPCM coder in accordance with the equation F5 or F6. Thus, the DPCM signal is:

$$\Delta s_i = s_i - a \, s_{i-1} - a\Delta s_{i-1,q} \tag{F8}$$

This equation states that the current DPCM signal is defined by the current sample $s_i$, less the specified terms. In operation of the apparatus shown in FIG. 1, the registers R1, R2, and R3 are controlled by clock pulses $T_0$ and $T_2$, and function as temporary memories or temporary storage devices. The information at the output of each of the registers changes at the end of the applied clock pulse. It is apparent that delay lines or other memories may be employed in place of the registers provided that the outputs thereof are made available at the appropriate times. The multipliers M1 through M3 do not exhibit any time delay between input and output, since they are realized by hard wiring. The indicated signal designations appearing in FIG. 1 apply for a time which immediately precedes the time $t_3$ just before a clock pulse $T_0$. The appearance of the clock pulses $T_0$ and $T_2$ are shown in the time diagram of FIG. 4. The individual lines of the time diagram of FIG. 4 are labeled with legends which appear at various points in FIG. 1.

The calcuation of the DPCM signal $\Delta s_i$ will be described, beginning with the time at which the sample $s_i$ appears at the input E. This time is indicated $t_0$ on the time diagram of FIG. 4, and coincides with a clock pulse $T_2$. With the occurence of this clock pulse, the arithmetic value $$s_{i-2} + \Delta s_{i-2,q} \qquad (9)$$

is loaded into the third register R3, the output of which is multiplied by the square of the prediction factor a, to produce the value $$a^2(s_{r,i-2}) = a \, s_{i-7} \qquad (10)$$

which is supplied to the subtraction input 8 of the first subtractor unit SU1, simultaneously with the presentation of the signal value $s_i$ at the input E. The difference $$s_i - a \, s_{i-1} \qquad (11)$$

appears at the output of the first subtractor unit SU1 and is stored in the first register R1 at the next clock pulse $T_0$, at time $t_1$. At the time of the clock pulse $T_0$, the DPCM signal at the output of the second register R2 is simultaneously changed. The initial value at the output of the register R2 is $$\Delta s_{i-1,q} \qquad (12)$$

After a short transit time, a modified value appears at the output of the adder AD at point 5

$$s_{r,i-1} = s_{i-1} + \Delta s_{i-1,q} \qquad (13)$$

With the next clock pulse $T_2$, at time $T_2$, the signal value at point 5 is transferred into the third register R3 and a new current estimated value $s_i$ is produced at the output 7 of the second multiplier unit M2.

The DPCM signal at the output A changes with the clock pulse $T_0$ at time $t_1$ and, therefore since the multiplication of the first multiplier M1 is instantaneous, the input value thus simultaneously appears at the subtraction input 9 of the second subtractor unit SU2. After a short transit time required by the second subtractor unit SU2, the calculated DPCM signal $\Delta s_i$ is supplied to the input of the quantizer Q, which produces as an output the quantized DPCM value $\Delta s_{i,q}$ which is supplied to the output A through the register R2 at the next clock pulse $T_0$ at time $t_3$. The operation of the adder AD, and the operation of the first subtractor SU1 are executed in the outer loop shown in FIG. 1 within the sampling interval $t_a$, and the timings of these arithmetic operations are not critical. By contrast, the timings of the arithmetic operations of the inner loop including the second subtractor unit SU2, the quantizer Q and the first multiplier unit M1, are very critical. The operation of the quanitizer Q requires the most time. Since the first multiplier unit M1 requires no calculating time, only two arithmetic operations are required during a sampling interval, namely the subtraction in the second subtractor unit SU2 and the operation of the quantizer Q.

If desired, the sequence of multipliers and registers can be interchanged. For example, the register R3 may be placed at the output of the multiplifer unit M2. It is likewise possible to connect the third register R3 immediately preceding the input of the adder AD which is received from the second multiplier unit M2. In that case, the samples $s_i$ at the input E should be supplied coincident with the clock pulse $T_0$.

The sequence of the quantizer Q and second register R2 may likewise be interchanged if desired. One then obtains a quantizing unit QE which corresponds to read-only memories which are presently commercially available. Also, to the extent that latch registers or the like are provided in the arithmetic circuits, the individual registers R1-R3 are not required as separate units.

In operation of the DPCM coder of FIG. 1, the reconstruction samples $s_r$ are provided to the local output AL in the interval between two clock pulses $T_0$ and $T_2$. However, they can also be made available at the output of the third register R3.

Figure 2:
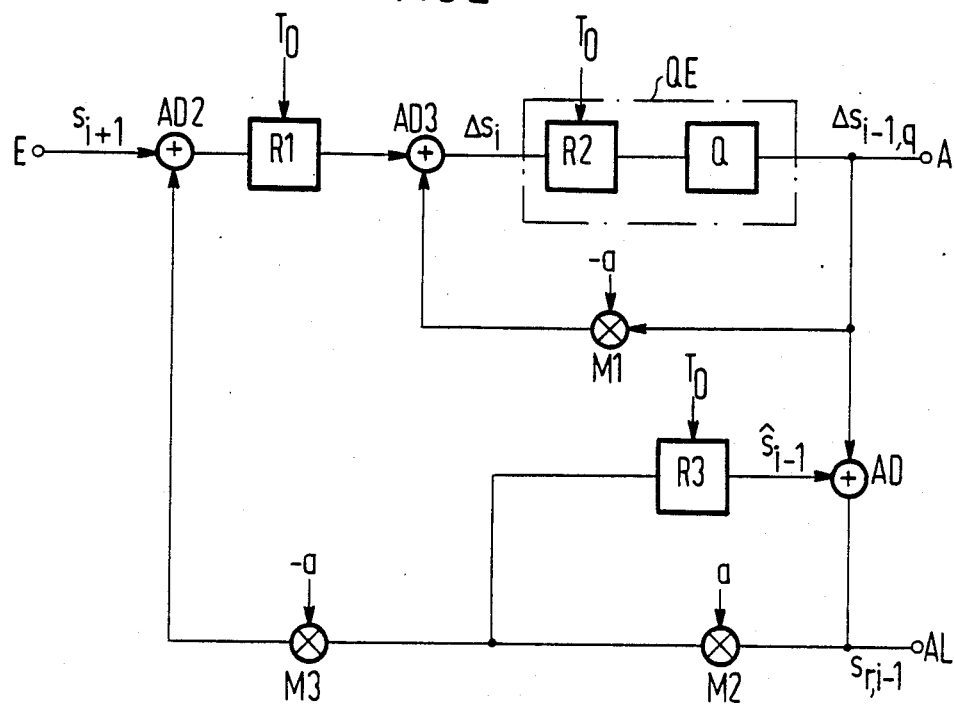
FIG. 2 is an illustration of a modified form of the DPCM coder of FIG. 1.

In the case where the third register R3 is inserted into the feedback from the output of the second multiplier unit M2 to the adder AD, then, neglecting the calculating time of the adder AD, the reconstruction samples $s_r$ are made constantly available at the local output AL. In this case, the third register R3 is controlled by the clock pulse $T_0$, and the samples at the input E likewise are made available coincident with this clock pulse. The arrangement is illustrated in FIG. 2. In the embodiment of FIG. 2, the subtractors SU1 and SU2 are replaced by a second adder AD2 and a third adder AD3, respectively. These adders are respectively supplied with the two's complement of the signals from the multiplier units M1 and M3 shown in FIG. 1, as indicated by the negative prediction factor −a indicated in FIG. 2.

Figure 3:
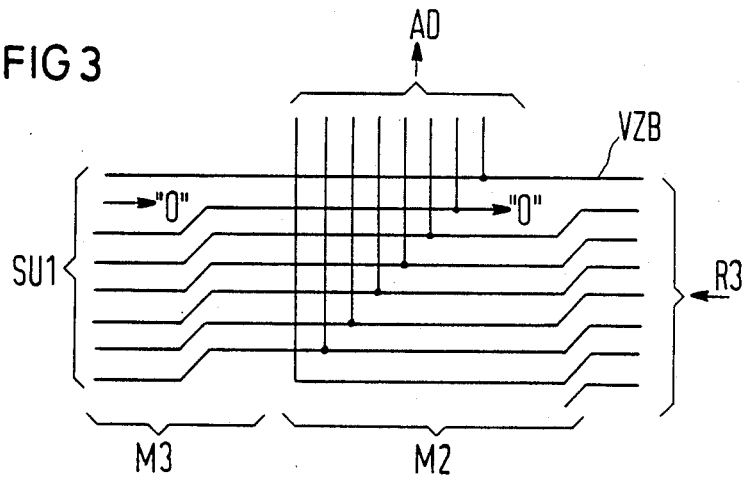
FIG. 3 is an illustration of the wiring for accomplishing the required multiplication.

FIG. 3 shows a circuit diagram for realizing the multipliers by means of hard wiring. In this example, multiplication is carried out with the factor ½. The second multipler unit M2 is realized by wiring which shifts all bits except the operational sign bit VZB by one binary place, and a binary "0" is inserted in the most significant bit after the operational sign bit VZB. This operation is repeated at the second multiplier unit M3. In a case where the multiplier factor is negative, which produces an output in the form of the two's complement of the unmodified output, a a binary 1 is inserted as the most significant bit after the operation sign bit.

It would be appreciated from the above description that the present invention offers a construction of apparatus which results in an improved speed of calculation within a DPCM coder, without requiring greatly increased complexity and cost of manufacture. Various additions and/or modifications in the apparatus of the present invention will be apparent to others skilled in the art, without departing from the essential features of novelty thereof, which are intended to be defined and secured by the appended claims.

What is claimed is:

1. A DPCM coder having an increased internal calculation speed comprising first and second arithmetic units connected in series with each other, said first arithmetic unit serving as the input stage of said DPCM coder and connected to receive digitized input samples, a quantizing unit connected to the output of said second arithmetic unit for producing quantized DPCM signals, means for supplying digitized input samples to the input of said first arithmetic unit, means including a first multiplier unit for connecting the output of said quantizing unit to an operand input of said second arithmetic unit, an adder unit connected to receive the output of said quantizer, a second multiplier unit connected to the output of said adder unit, the output of said second multiplier unit being connected to a further input of said adder, and means for connecting the output of said second multiplier to an operand input of said first arithmetic unit.

2. A DPCM coder according to claim 1, including a first storage unit interconnected between said first arithmetic unit and said second arithmetic unit.

3. A DPCM coder according to claim 1, including a storage unit interconnected between the output of said adder and the input of said second multiplier.

4. A DPCM coder according to claim 1, wherein said quantizing unit incorporates a storage device.

5. A DPCM coder according to claim 1, including a storage unit connected between said second multiplier and said further input of said adder.

6. A DPCM coder according to claim 1, wherein said storage devices comprise clock controlled registers.

7. A DPCM coder according to claim 1, wherein said arithmetic units and said adder comprise clock controlled arithmetic units.

8. A DPCM coder with increased internal calculation speed, comprising a first adder connected to receive an input digitized sample, a second adder connected to the output of said first adder, a quantizing unit connected to the output of said second adder, a multiplier unit connected between the output of said quantizing unit and an input of said second adder, a third adder connected directly to the output of said quantizer unit, and a second multiplier connected between the output of said third adder and a second input of said first adder, and means for suppling the output of said second multiplier to a second input of said third adder, said first multiplier being adapted to multiply the output of said quantizer with the two's complement of a predication factor.

9. A DPCM coder according to claim 1, wherein each of said multipliers comprise a parallel multiplier having a plurality of inputs and a plurality of outputs, said plurality of outputs being connected directly to different ones of said plurality of inputs, whereby said output represents a quantity which is a multiple or submultiple by a power of two relative to said input.

10. A DPCM coder according to claim 1, including a first storage unit interconnected between said first arithmetic unit and said second arithmetic unit and a second storage unit interconnected between the output of said adder and the input of said second multiplier, said first and second storage units adapted to be loaded simultaneously, coincident with a clock pulse, and including a third storage device connected between said adder and said second multiplier, said third storage device being adapted to be loaded at times intermediate said clock pulses.

11. A DPCM coder according to claim 1 wherein said first and second arithmetic units comprise first and second subtractor units.

* * * * *